United States Patent [19]

White

[11] Patent Number: 4,679,063
[45] Date of Patent: Jul. 7, 1987

[54] INFRA RED DETECTORS

[75] Inventor: Anthony M. White, Malvern, England

[73] Assignee: The Secretary of State for Defence in Her Britannic Majesty's Government of the United Kingdom of Great Britain and Northern Ireland, London, England

[21] Appl. No.: 534,692

[22] Filed: Sep. 22, 1983

[30] Foreign Application Priority Data

Sep. 23, 1982 [GB] United Kingdom ............... 8227180

[51] Int. Cl.[4] ............................................. H01L 27/14
[52] U.S. Cl. ...................................... 357/30; 357/16; 357/61; 250/338
[58] Field of Search ........................ 357/16, 30, 61, 34; 136/255; 250/370 J, 370 R, 370 X, 370 K, 338 SE

[56] References Cited

U.S. PATENT DOCUMENTS

| | | | |
|---|---|---|---|
| 3,497,698 | 2/1970 | Phelan | 357/30 |
| 3,995,159 | 11/1976 | Elliot | 250/370 |
| 4,016,586 | 4/1977 | Anderson | 357/16 |
| 4,021,833 | 5/1977 | Gurnee | . |
| 4,106,951 | 8/1978 | Masi | 357/30 |
| 4,242,695 | 12/1980 | Ouchi | 357/30 |
| 4,297,720 | 10/1981 | Nishizawa | 357/30 |
| 4,346,394 | 8/1982 | Figueroa | 357/16 |
| 4,427,841 | 1/1984 | Rahilly | 136/255 |
| 4,453,173 | 6/1984 | Carlson | 357/30 |

FOREIGN PATENT DOCUMENTS 1450627 9/1976 United Kingdom .
1597538 9/1981 United Kingdom .

OTHER PUBLICATIONS

IEEE Conference of Photovoltaic Specialists, Jun. 5, 1978, paper by Arienzo & Loferski.

Primary Examiner—Andrew J. James
Assistant Examiner—Mark Prenty
Attorney, Agent, or Firm—Cushman, Darby & Cushman

[57] ABSTRACT

A detector in which a barrier region is interposed in the current path between the emitter and collector of the detector. This region is of a material having a valence band edge approximately level to that of the emitter material and an appreciably wider band gap. It thus serves to impede majority carrier current flow and as a consequence device resistance is high. When the detector is biased, the pedestal contribution to detector signal is low. The collector may be of semiconductor material of the same majority carried type as the emitter material; or may be of opposite type but dopant enriched; or it may be a Schottky metal contact. In one variant of the detector, the emitter and collector are located on opposite sides of the barrier and are of different bandgap materials. The infra red band response of this detector can be changed by reversing bias polarity. In another variant of the detector the emitter is in strip form and has a pair of bias contacts. The barrier and collector are located on the strip at a position between these contacts and provide a high resistance read-out structure. In one further variant of the detector the emitter, the collector, together with additional emitter-collector regions, are formed from a single layer of photosensitive material on one side of the barrier and provide a high resistance, series connected, multi-element structure.

15 Claims, 9 Drawing Figures

INFRA RED DETECTORS

TECHNICAL FIELD

The present invention concerns the structure and application of infrared detectors, particularly photoconductive detectors.

BACKGROUND ART

Conventional infrared photodetectors formed of cadmium mercury telluride (CMT) alloy materials are well known, both simple two contact photoconductors and single p-n homojunction photodiodes. Recent developements have seen time-delay-integration functions included in the photoconductive element—see for example UK Pat. No. 1,488,258, where the detector is of strip shape and the photocarrier drift rate is matched to the velocity of a scanned image.

A major problem associated with conventional photoconductors, particularly those used in unscanned "staring" applications is a standing DC output (known as a bias "pedestal") even in the absence of any input optical flux. For conventional long wavelength intrinsic photoconductors, the impedance is low, and the standing current is typically several milliamps corresponding to a pedestal of a few volts. For comparison the background flux signal is millivolts, and the required optical signal is microvolts. This pedestal is exceptionally difficult to subtract out in a stable and accurate manner except in the case of a scanned system which can use capacitative output coupling.

Photovoltaic detectors—e.g. photodiodes, have the advantage that they do not require bias, do not dissipate significant power, nor do they have a bias pedestal. Juction diode detectors, however, are difficult to make and require a bulk of scarce and largely uncharacterized p-type CMT. They also suffer stability problems upon the high temperature storage conditions typical of a military user environment, as also upon long-term operation.

DISCLOSURE OF THE INVENTION

The invention is intended to provide a long wavelength intrinsic photoconductive detector of high impedance. Being of high impedance, the problem of bias pedestal is minimized.

According to the invention there is provided an infrared detector comprising:
  an emitter region formed of material photosensitive to infrared radiation;
  a collector region;
  a pair of contacts, one an emitter contact, the other a collector contact and;
  a barrier region, adjacent both to the emitter region and the collector region, formed of material having a valence band edge common with, or at least near level to, that of the photosensitive material, and having a band gap that is wider than that of the photosensitive material, this region thus providing a barrier to the flow of majority carriers from the emitter region while at the same time being conductive for minority carriers injected therefrom.

Since the barrier region provides a barrier to the flow of majority carriers from the emitter, the detector exhibits high impedance. Since, however, minority carriers are free to pass this barrier region, under illumination and with appropriate bias, photocurrent will be generated and the detector will behave as a photoconductor.

Preferably the emitter and barrier materials are ternary alloys of the same chemical species. Examples are: n-type/n-type, n-type/p-type, or p-type/n-type compositions of cadmium mercury telluride; or of indium gallium arsenide; or of gallium aluminium arsenide. The barrier material may however be a composition of different chemical species, provided emitter and barrier materials have a common or near common valence band. The barrier material may be a binary alloy or compound having a common anion with the ternary material. Examples are: cadmium mercury telluride and cadmium telluride; gallium aluminium arsenide and gallium arsenide; or indium gallium arsenide and indium arsenide.

To avoid the need for compositional gradation at the emitter-barrier interface in order to remove large heterostructure discontinuities in bands, it is preferable that the emitter and barrier materials are n-type and p-type, respectively.

The collector region may be of material of like majority carrier type to the emitter material, having a valence band limit common with or at least near level to that of the barrier material. Alternatively it may be of a high work function metal, or of a heavily doped semiconductor material of opposite majority carrier type to the emitter material. When of metal, the collector region is provided by the collector contact itself.

One form of the detector is of planar structure wherein the emitter, barrier and collector regions are provided by n-type, p-type and n-type layers of materials, respectively. In this structure the emitter and collector regions may be of like material thus having like band gap characteristics. This detector has non-linear performance characteristics under illumination conditions and may thus be included in circuit with a source of alternating bias or of modulated AC bias, the collector being followed by an integrator, harmonic filter or demodulator, as appropriate. In a variant structure of this form of detector, the emitter and collector materials are of like majority carrier type, one material of composition suited for the detection of infrared radiation of wavelength in the 3-5 $\mu$m band, the other material of composition suited for the detection of infrared radiation of wavelength in the 8-14 $\mu$m band. This detector thus has responsivity to one band at a time, which one depending on the direction of bias. It may thus be included in a circuit including a source of DC bias, a bias that can be switched from one direction to the other, for waveband selection. Alternatively it may be included in a circuit including a source of AC bias, and have a phase-sensitive or gated amplifier following the collector. Separately gated circuits will produce two channel output with data from an individual band in each channel.

Another form of the detector, also of planar structure, is comprised of two layers of material of different majority carrier type, the material of one layer being of significantly wider band gap, the other layer being delineated to define the emitter and collector regions of the detector.

In another form of the detector, the emitter region is provided by an extensive strip length of material, and the barrier and collector regions are arranged to provide a read-out region for this strip. Such a detector may then be included in the focal plane of a scanning optical system, and biased such that photocarriers generated in the strip drift at a rate matched to the scan velocity. This affords insitu signal integration.

BRIEF DESCRIPTION OF THE DRAWINGS

In the drawings accompanying this specification.

DESCRIPTION OF PREFERRED EMBODIMENTS

Embodiments of the invention will now be described, by way of example only, with reference to the accompanying drawings.

Figure 1:
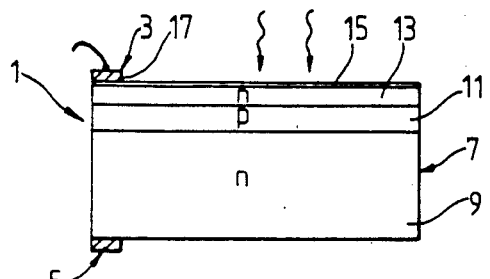
FIG. 1 is a cross-section drawing showing the structure of an n-p-n composite photodetector embodying features of the invention.

The photodetector 1 shown in FIG. 1 is comprised of two ohmic contacts 3 and 5, one each side of a triple layered structure 7 of cadmium mercury telluride (CMT) materials. This structure 7 is comprised of a first layer 9 of n-type cadmium mercury telluride formed from a slice cut from a good quality single crystal. The upper two layers, layers 11 and 13 of p-type and n-type cadmium mercury telluride materials, respectively, have been prepared either by sputtering or epitaxial techniques [vapour phase epitaxy (VPE), liquid phase epitaxy (LPE), molecular beam epitaxy (MBE), or chemical vapour deposition (CVD)].

The outer n-type layers 9 and 13 provided have equal band gaps ~0.1 eV (see FIG. 2) and are of a cadmium mercury telluride material that is suited to the detection of infrared radiation in the 8–12 $\mu$m band ($Cd_xHg_{1-x}Te$: x=0.20). Each layer 9 and 13 has a donor concentration of the order of $5 \times 10^{14}$ cm$^{-3}$. At an operational temperature circa 80° K. (as for liquid nitrogen cooling), the intrinsic carrier concentration is typically $2.5 \times 10^{13}$ cm$^{-3}$ and the minority carrier (hole) concentration is $1.2 \times 10^{12}$ cm$^{-3}$. The uppermost n-type layer 13 is thin ($\leq 10$ $\mu$m) as for a shallow junction photodiode. This layer 13, the surface of which is exposed during operation to focussed infrared radiation, has as contact 3 one which is optically reflecting, that minimizes minority carrier generation—recombination at the layer surface, and that provides a wide gap window. This contact 3, is one of compound structure and consists of a thin layer 15 of strongly doped n-type CMT of a slightly larger band gap (e.g. n±type CMT, and, x<0.20, 10 $\mu$m thick) to which simple ohmic metallic edge or ring contact 17 is made.

The sandwiched layer, the p-type layer 11, is of cadmium mercury telluride material of significantly large band gap ~0.5 eV (i.e. it is of cadmium enriched material; x~0.45). It is doped p-type with the same or closely similar Fermi level (FL) above the valence band (VB) as in the n-type cladding layers 9 and 13. Since the valence band densities of states are similar (hole effective mass 0.55; insensitive to composition) the hole concentration is appreciably constant throughout the device. The interface between the upper n-type layer 13 and the sandwiched p-type layer 11 is a p-n junction without a depletion zone, ie there is no space charge layer at zero bias. The center layer 11 is of thickness between 3–10 $\mu$m, a compromise between tunneling, conductivity, trapping and depletion under bias conditions.

Figure 2:
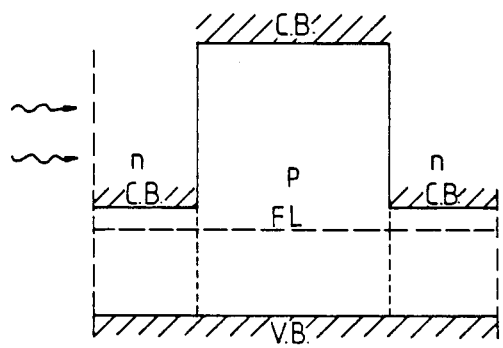
FIGS. 2, 3(a) and (b) are band level energy diagrams for the detector structure shown in the preceding figure for zero, forward and reverse bias respectively.

In this structure (FIG. 1) electron current flow is blocked by an energy barrier (FIG. 2). This barrier is due to a heterostructure conduction band discontinuity. There is, however, no barrier at all to holes, carriers which are generated in the upper n-type layer 13 by photoconversion, an optical absorption process. The detector device 1 behaves as a photoconductor, as will now be discussed below.

Figure 3:
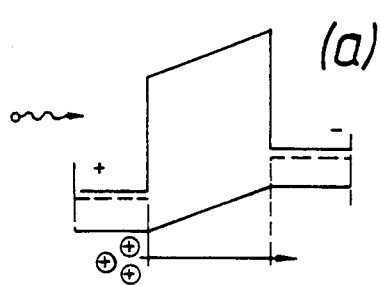
Figure 3:
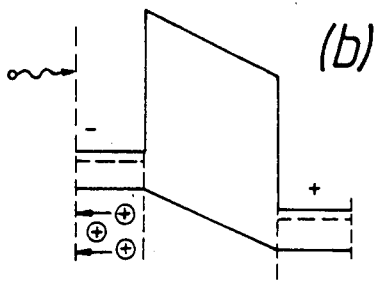

Because of the relatively high electron concentration and high electron mobility in the n-type layers 9 and 13, the resistance of these layers is negligible compared with that of the centre layer 11. Any external voltage applied to the device 1 appears across the center region 11. Because of the absence of a barrier to holes, a hole current will flow, limited however by the restricted availability of holes relative to the high concentrations which would be provided by ohmic contact. Because no field can be established in the n-type layers 9 and 13, only diffusion currents flow there. Consider radiation incident from above the device 1 with the top contact 3 (the emitter contact) biassed positively with respect to the other contact 5 (the collector contact). Holes will be generated in the emitter layer 13 and will disappear by recombination at the contact 3, or by recombination in the bulk of the emitter layer 13 or by transferring to the center layer 11. Since the width of the emitter layer 13 is small compared with a diffusion length (~30 $\mu$m), bulk recombination processes can be ignored, at least to a first approximation. It can be shown that the concentration of optically generated holes is considerably larger than the concentraion of thermally generated holes, so the latter concentration can also be ignored. The energy level diagram for this choice of bias is shown in FIG. 3(a).

On application of this bias, the generated carriers are swept across the center layer 11. Holes are the majority carriers for this center layer 11 and have an even longer bulk recombination lifetime in this lightly p-doped material than the typical lifetime (1–20 $\mu$sec) in n-CMT. Strictly, space charge controlled currents flow in this zone but it can be shown that for reasonable applied fields (1 volt across 10 $\mu$m, corresponding to $10^3$V/cm) and typical currents (corresponding to the flux from background radiation at 300° K. and f/2.5 field of view) the field does not vary excessively. As a result a simple description of current flow is obtained by solving the continuity equation at the first interface. In the collector layer, layer 9, the holes arrive by minority carrier injection at the forward biassed interface, and build up until the recombination rate by bulk processes, or at the contact 5, balances the rate supplied by the current.

The generation and distribution of minority carriers in the emitter layer 13 are very similar to the conditions prevailing in a reverse biassed shallow junction photodiode. The optical generation rate corresponding to the above quoted background conditions, with quantum efficiency 0.9, is for a thickness of 10 $\mu$m, $6.8 \times 10^{20}$ cm$^{-3}$ sec$^{-1}$. This is to be compared with a thermal generation rate of ~$5\times10^{17}$ cm$^{-3}$ sec$^{-1}$, about $10^3$ times smaller. Accordingly the thermal generation rate can be ignored. The optically generated carriers diffuse to the top contact 3 which can be characterised by a surface recombination velocity $S_c$, to the interface with the center layer which in this approximation appears as a surface with recombination velocity $\mu E$ where E is the field in the p-type layer and $\mu$ the hole mobility, or they recombine in the bulk.

For $\mu = 300$ cm$^2$/volts sec and $E = 10^3$ volts/cm, $\mu E = 3\times10^5$ cm/sec.

The effective time constant for removal at the interface 13/11 is $3\times10^{-4}/\mu E = 10^{-9}$ seconds ignoring diffusion effects. This is limited by the diffusion time to reach the surface, about $3\times10^{-8}$ seconds, a time still much shorter than the bulk recombination lifetime. If $S_c << 3\times10^5$ cm/sec then the majority of the carriers $\phi$ will be transferred to the p-type layer 11, in which case $J = \phi q$ and $J = pq\mu E$ gives the hole concentration p in the p-type layer 11. Under the quoted conditions $p \sim 1.1\times10^{-13}$ cm$^{-3}$ with a current density of 0.1A/cm$^2$. For comparison, the hole concentration in the undepleted p-type layer 11 is ~$1.3\times10^{12}$ cm$^{-3}$. In the high field of the center layer 11 these thermally generated carriers are reduced to a negligible fraction of the signal current.

In the n-type collector layer 9 the concentration of carriers rises until the recombination rate balances the supply rate. The effect of the structure is to separate the region where carriers are generated from the region where they recombine.

There is a space charge phenomenon induced by the minority carrier injection into the collector layer 9. As the minority carrier concentration rises above the thermal equilibrium, the electron concentration also rises to maintain neutrality. In this low band gap material, which is dominated by Auger recombination, this will cause a reduction of the minority carrier lifetime. There is a converse effect in the emitter layer 13 induced by the extraction field, but counterbalanced by the generation of excess holes by the incident radiation. In order to significantly reduce the recombination life-time, the excess hole concentration must approach the thermal equilibrium electron concentration ~$5\times10^{14}$ cm$^{-3}$, depending on the doping.

A leakage current under zero illumination is also obtained. For the conditions given the leakage current is ~$3\times10^{-3}$ amps/cm$^2$ corresponding to a value of RoA ~26 ohm cm$^2$. This high resistance value stems from the fact that there is no minority electron leakage. For a planar device 50 $\mu$m square, with area $2.5\times10^{-5}$ cm$^2$ the saturation leakage current is $7.5\times10^{-8}$ amps, compared to the background induced current of $2.5\times10^{-6}$ amps. (The leakage current can be compared with the standing current of a photoconductor of the same light gathering area, but driven longitudinally, ~$5\times10^{-3}$ amps).

The noise in this device 1 is essentially the fluctuation noise of background radiation.

The capacitance of this device 1 is very low, ~0.02 pF for the 50 $\mu$m square planar device. Encapsulated structures therefore will have a capacitance which is limited by packaging and configuration rather than by fundamental device properties.

This device has a number of characteristics common to both photoconductors and photodiodes, but lacks some of the most serious drawbacks of those devices. It has zero output at zero bias with the negligible tunnelling associated with a photoconductor, and yet has a zero signal leakage current typical of the very best heterojunctions, in which minority carriers from only one side participate in leakage. In addition the capacitance is very low, a value typical of a p-i-n diode structure, and the space charge generation-recombination is low. Consequently it has application to many of the circuits devised for diodes, though in the symmetric version described above, bias has to be supplied.

The photodetector 1 described above thus performs as a high impedance photoconductive detector when the collector contact 5 is biassed negative with respect to the emitter contact 3. [FIG. 3(a)]. This photodetector 1 may also be operated using constant AC or modulated AC bias. For these modes of operation the device behaves as a non-linear detector, ie a detector whose responsivity depends on bias direction. During the AC cycle, whle the upper p-n junction 11-13 is reversed biassed, as shown in FIG. 3(a), the detector 1 behaves as described above, and a photocurrent flows in the collector circuit. However, at other times during the AC cycle, during which the upper p-n junction 11-13 is forward biassed, the minority carriers generated in the upper n-type layer 13 under illumination are attracted to the emitter contact 3, as shown in FIG. 3(b). The output devleoped from the heterostructure device is thus now merely leakage current due to minority carrier generation in the collector layer 9. No appreciable number of minority carriers, however, is generated optically in the collector layer. Infrared radiation in the 8-14 $\mu$m band is absorbed in the upper photosensitive layer 13; little if any can penetrate the device 1 to reach the collector layer 9. In terms of the photosignal the responsivity ratio is therefore extremely high, largely limited to the photoconductive signal developed in the emitter layer itself, and this can be disregarded as the field in the emitter layer is neglibibly small, and because so little radiation penetrates beyond the emitter layer 13.

The photodetector 1 may thus be incorporated with an AC bias circuit. Useful photosignal can then be extracted by following the collector contact 5 with an integrating circuit. Because the device is nonlinear under illumination conditions, the time averged AC signal will produce a finite measurable component dependant upon illumination intensity. However, in the absence of incident radiation, the current voltage characteristic of this detector 1 is reasonably linear. Thus application of AC bias followed by integration ensures that the output signal in the absence of radiation is excactly zero. This mode of bias thus avoids any problem of bias pedestal, even though this is in any case smaller than that for conventional photoconductive detectors in view of the unusally large impedance that is a characteristic of this device.

As alternative to the use of an integrator in the AC biassed circuit described above, the collector circuit could include instead a harmonic frequency filter. The device 1 as described is non-linear and thus generates measurable harmonics under illumination.

Instead of constant AC bias, modulated AC bias can be used and the resultant signal demodulated to produce desired signal. The modulation waveform would in this case be chosen so that the signal can be extracted at a frequency above the system 1/f noise knee frequency. Alternatively, the AC bias could be coded and the output decoded to eliminate noise.

The detector 1 described above is a three-layer structure of CMT materials. The center layer 11, however, could instead be of different material—for example p-type cadmium telluride. The essential requirements for this choice of different material being that it is one of wide band gap characteristic, and offers little valance band distortion across each p-n interface 11-13 and 11-9. In the case of cadmium telluride, a suitable choice is low carrier concentration (compensated) p-type material with the same or very similar depth of Fermi level above the valence band as in the n-type CMT cladding layers 9 and 13. The Fermi level in this cadmium telluride layer 11 would be pinned by an acceptor donor such as silver Ag (Ea~0.114 eV) or a combination of acceptors. Since the valence band densities of state are similar for these choices of CMT/CdTe materials, the hole concentration is effectively constant throughout the structure 7. Because of this alignment of Fermi levels and application of the common anion rule (this applies to the CMT/CdTe common anion tellurium system) the valence band is level and undistorted throughout the structure 7. Small discrepancies are reduced by inevitable compositional grading.

Similar effects may be expected in other systems obeying the common-anion rule. The most obvious examples are the gallium arsenide-gallium aluminium arsenide (GaAs-GaAlAs) and indium arsenide—indium gallium arsenide (InAs-InGaAs) systems.

Figure 4:
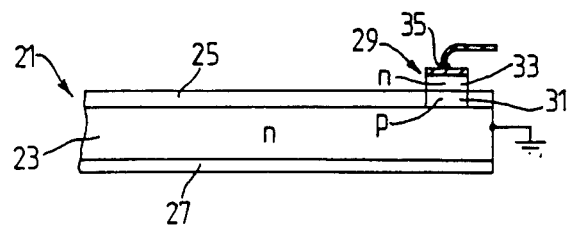
FIG. 4 is a cross-section drawing showing an alternative structure of n-p-n composite photodetector, a strip detector.

A CMT/CdTe photodetector 21 of modified configuration is shown in FIG. 4. It is in the form of an elongate strip filament 23 of n-type cadmium mercury telluride material passivated by layers 25 and 27, of intrinsic cadmium telluride material, one adjacent to each surface top and bottom of the CMT filament 23. At one end of this filament 23 a read-out contact structure 29 is provided. This structure 29 together with the filament 23 of n-type CMT has the form of a triple layer structure similar to that described above.

Here a p-type barrier region 31 is formed by modifying a part of the upper passivation layer 25 of cadmium telluride by dopant implantation/diffusion. Above this barrier region 31 a collector region 33, also of n-type CMT, and, an ohmic compound contact 35 are provided. This detector 21 may be used as an integrating focal plane photo-conductive detector in an optically scanned system, for example in a system such as is described in UK Pat. No. 1,488,258. In such a system radiation is focussed onto the strip filament 23 and is scanned along the length of the filament towards the read-out contact 29 at a velocity that is matched to the drift velocity of ambipoloar photo-carriers driven under DC bias applied to the filament. These ambipolar carriers result from photoconversion and their density increases in spatial correspondence with the image. Minority carriers, components of the ambipolar photocurrent, are extracted at the readout contact. A read-out signal is thus provided, a signal that in time follows the spatial intensity variations of the scanned image of a thermal scene.

Figure 5:
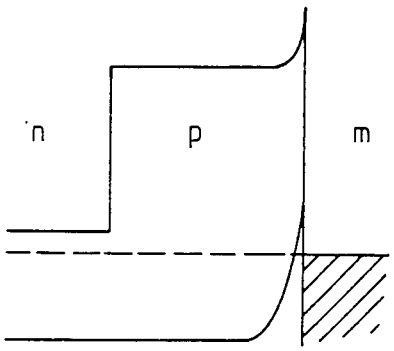
FIGS. 5(a) and (b) are band level energy diagrams for metal collector and degenerate semiconductor collector variants respectively, of the photodetector shown in preceding FIG. 1 above.
Figure 5:
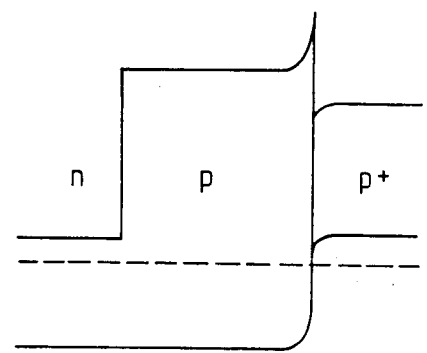

It is also possible to substitute alternative material for the collector layer 33. It could be of low gap p-type material (thus making a p+-p-n structure—see the energy diagram FIG. 5(b)—or it could be an ohmic contact—see the energy diagram FIG. 5(a). A high work function metal is used for the ohmic contact. Such contacts are difficult to prepare however, so the heavily doped semiconductor of FIG. 5(b) is more favoured. This semiconductor could be of cadmium telluride, zero-gap CMT, or even mercury telluride.

Figure 6:
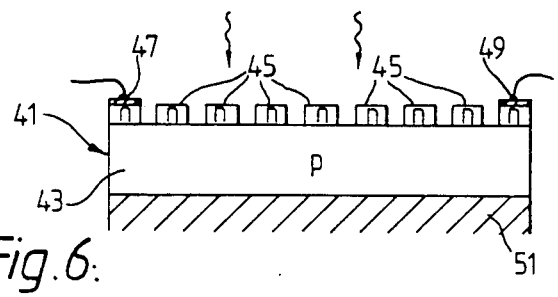
FIG. 6 is a cross-section view of a two layer structure photodetector, an alternative to the structure shown in FIG. 1 above; and, FIG. 7 is a band level energy drawing for a two-color sensitive detector, a variant of the detector shown in FIG. 1 above.

An alternative n-p-n structure 41 is shown in FIG. 6. This is a device of a lateral structure in which the n-type emitter and collector regions are formed from a single epitaxial layer disposed on one surface only of a substrate layer 43 of p-type wide band gap material. These regions are formed as stripes 45 which are delineated by etchant. Those at each end of the device 41 are provided with ohmic contacts 47 and 49. Though the electric field distribution in this device 41 is somewhat complex, the principle of operation is basically unchanged. High field regions exist only between the photosensitive stripes 45 of n-type CMT. The base layer 43 is either self-supporting, or in the more usual case is bonded onto a supporting insulating substrate—e.g. a substrate 51 of sapphire as shown. In each case there is a signifcant refractive index mismatch at the lower surface/interface for this base layer 43. Thus radiation passing through the gaps in the photosensitive n-type CMT layer will be reflected and in the main part will be absorbed in the photosensitive region 45 following reflection. The physical size of the stripes 45 and the spacing between them must be kept small because a proportion of the bias field lines between the stripes take a relatively long route. The minority carrier transport in the n-layer stripes 45 is essentially due to diffusion, so the hole minority carriers do not emerge solely from the corners of the stripes.

Figure 7:
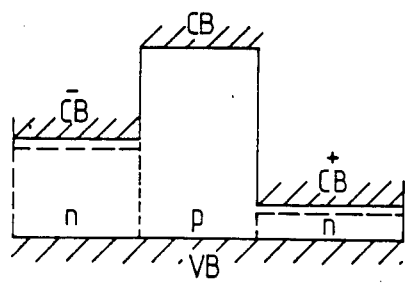

The detector having the structure shown in FIG. 1 may be readily adapted for "two-color" detector application. In this case the top layer 13 is of relatively high band gap material, a material having a band gap that is intermediate to the band gaps of the lower two layers 11 and 9. Consider, to illustrate this application, a detector responsive to radiation in the 3–5 $\mu$m and 8–14 $\mu$m bands. For this the top layer is formed of n-type CMT material suited to detection of radiation in the 3–5 $\mu$m band ($x=0.28$), and the bottom layer is formed of n-type CMT material suited to detection of radiation in the 8–14 $\mu$m band ($x=0.2$). The Fermi level is graded in the center layer 11 to accommodate the different levels in the two cladding layers 9 and 13. A small standing bias (equal to the difference in work functions) has then been applied to reach the neutral situation shown in the energy diagram—FIG. 7. In forward bias (drift from surface towards interior, left to right of FIG. 7) only 3–5 $\mu$m radiation will be detected, because of the asymmetry. Radiation at energy less than the window energy passes through the structures 7 to the lower energy gap material, layer 9. Though this will generate photocarriers, for this direction of bias, since the field across the collector layer is inappreciable, the response to 8–14 $\mu$m band radiation is negligible. The signal corresponds to 3–5 $\mu$m band absorption in the top layer 13. When, however, the bias direction is reversed, the signal due to 3–5 $\mu$m band absorption is negligible. In this case photocarriers generated in the lower layer 9 by photoconversion of the 8–14 $\mu$m band, are driven across the drift zone provided by the centre layer 11, and generate signal. Detector responsivity to 3–5 $\mu$m band radiation and to 8–14 $\mu$m band radiation can thus be switched by changing the direction of DC bias. Alternatively, the detector may be AC biassed, in which case output selection for each band is by phase; the signal is sensed by a gated amplifier.

A detector similar to that shown in FIG. 1 could also be used as an upconverter. An upconverting effect arises provided the radiative efficiency of recombination in the collector is high. The band gap of the collector is here chosen high enough so that emitted radiation can be received either directly or by a near-infrared vidicon camera.

An inverted device with respect to n- and p- type materials is feasible, although it would demand greater control of the hetrostructure interfaces. Because of the hetrostructure discontinuity in the band structure, which would have to be graded out during layer growth, there is an extended zone with practically indeterminate carrier recombination properties. However, the high carrier mobility would place less restriction on device operating voltages. The emitter interface field can be very low and yet still provide the high drift velocity necessary for high emitter efficiency. The doping concentrations of p-type material generally available are $>1\times10^{16}$ cm$^{-3}$ so that minority (electron) concentration in the emitter is extremely small. Although the lifetime is very short, the high diffusion constant ensures that the diffusion length is, as above, a few tens of microns. The high generation rate of minority carriers however means that background limited performance (BLIP) would be difficult to achieve.

I claim:

1. An infrared photoconductive detector comprising:
   (1) an n-tpe semiconducting emitter region of infrared photosensitive material;
   (2) a collector region, the emitter and collector region materials being of the same majority carrier type;
   (3) emitter and collector contacts; and
   (4) a barrier region connecting the emitter and collector regions, said barrier region:
      (a) comprising p-type semiconductor material,
      (b) having a valence band substantially common with the emitter material valence band,
      (c) having a wider band gap than the emitter material and providing a heterostructure conduction band discontinuity with the emitter region, and
      (d) being arranged such that electron flow between the emitter and collector regions is impeded while corresponding hole flow is substantially unimpeded.

2. An infrared photoconductive detector comprising:
   (1) an n-type semiconducting emitter region of infrared photosensitive material;
   (2) a collector region, the collector region being of heavily doped semiconductor material of the opposite majority carrier type to that of the emitter region material;
   (3) emitter and collector contacts; and
   (4) a barrier region connecting the emitter and collector regions, said barrier region:
      (a) comprising p-type semiconductor material,
      (b) having a valence band substantially common with the emitter material valence band,
      (c) having a wider band gap than the emitter material and providing a heterostructure conduction band discontinuity with the emitter region, and
      (d) being arranged such that electron flow between the emitter and collector regions is impeded while corresponding hole flow is substantially unimpeded.

3. An infrared photoconductive detector comprising:
   (1) an n-type semiconducting emitter region of infrared photosensitive material;
   (2) a collector region;
   (3) emitter and collector contacts; and
   (4) a barrier region connecting the emitter and collector regions, said barrier region:
      (a) comprising p-type semiconductor material,
      (b) having a valence band substantially common with the emitter material valence band,
      (c) having a wider band gap than the emitter material and providing a heterostructure conduction band discontinuity with the emitter region, and
      (d) being arranged such that electron flow between the emitter and collector regions is impeded while corresponding hole flow is substantially unimpeded and the emitter and collector regions being adjacent to the same side of the barrier region.

4. A detector, as claimed in claim 3, wherein the emitter region and collector region are formed from a single layer of material.

5. A detector, as claimed in claim 3, wherein the emitter region is of ternary alloy material, one of the infrared photosensitive ternary alloys cadmium mercury telluride, indium gallium arsenide, or gallium aluminium arsenide.

6. A detector, as claimed in claim 5, wherein the barrier region is also of ternary alloy material, an alloy including the same constituent elements but in different proportion.

7. A detector, as claimed in claim 9, wherein the barrier region is of binary alloy material, the ternary and binary alloys having a common anion constituent.

8. A detector, as claimed in claim 3, whrein the emitter region and the barrier region are of n-type and p-type doped extrinsic materials, respectively.

9. A detector, as claimed in claim 3, wherein the collector region and collector contact are formed of a single layer of high work-function metal.

10. A detector as claimed in claim 4, including at least one intermediate region, between said emitter and collector regions, being formed from said single layer and being arranged to relay holes from the emitter region to the collector region.

11. An infrared photoconductive apparatus comprising: an infrared photoconductive detector, including:
   (1) an n-type semiconducting emitter region of infrared photosensitive material;
   (2) a collector region;
   (3) emitter and collector contacts; and
   (4) a barrier region connecting the matter and collector regions, said barrier region comprising p-type semiconductor material, having a valence band substantially common with the emitter material valence band, having a wider band gap than the emitter material and providing a heterostructure conduction band discontinuity with the emitter region, and being arranged such that electron flow between the emitter and collector regions is impeded while corresponding hole flow is substantially umimpeded;
   wherein the emitter and collector regions are disposed on opposite sides of the barrier region and the emitter and collector regions are of different band-gap materials of the same majority carrier type, one material being photosensitive to radiation of one wavelength band, the other material being photosensitive to radiation of another wavelength band of the infrared spectrum;
   a voltage source connected between the emitter contact and collector contact;

a switch for changing the polarity of the voltage source; and a signal current detector responsive to collector current generated by the detector.

12. An infrared photoconductive apparatus comprising: an infrared photoconductive detector, including:
  (1) an n-type semiconductor emitter region of infrared photosensitive material;
  (2) a collector region;
  (3) emitter and collector contacts; and
  (4) a barrier region connecting the emitter and collector regions, said barrier region comprising p-type semiconductor material, having a valence band substantially common with the emitter material valence band, having a wider band gap than the emitter material and providing a heterosturcture conduction band discontinuity with the emitter region, and being arranged such that electron flow between the emitter and collector regions is impeded while corresponding hole flow is substantially umimpeded;
  wherein the emitter and collector regions are disposed on opposite sides of the barrier region and the emitter and collector regions are of different band-gap materials of the same majority carrier type, one material being photosensitive to radiation of one wavelength band, the other material being photosensitive to radiation of another wavelength band of the infrared spectrum;

a source of alternating voltage bias connected between the emitter contact and collector contact; and a phase-sensitive detector means for separating signals developed during the positive and negative half-cycles, respectively, of the alternating voltage bias.

13. An infrared photoconductive detector comprising:
  (1) an n-type semiconducting emitter region of infrared photosensitive material;
  (2) a collector region;
  (3) emitter and collector contacts; and
  (4) a barrier region connecting the emitter and collector regions, said barrier region:
    (a) comprising p-type semiconductor material;
    (b) having a valence band substantially common with the emitter material valence band,
    (c) having a wider band gap than the emitter material and providing a heterostructure conduction band discontinuity with the emitter region, and
    (d) being arranged such that electron flow between the emitter and collector regions is impeded while corresponding hole flow is substantially unimpeded and the emitter and collector regions being ajdacent to mutually opposite sides of the barrier region, the emitter region being in the form of a strip of material photosensitive to infrared radiation, this strip having two bias contacts, one the emitter contact aforementioned, the other an additional contact; the barrier region, collector region and collector contact together providing a read-out structure located between the two bias contacts at a position remote from the additional contact.

14. An infrared photoconductive detector comprising:
  (1) an n-type semiconducting emitter region of infrared photosensitive material;
  (2) a collector region, said emitter and collector regions being of the same band-gap material;
  (3) emitter and collector contacts; and
  (4) a barrier region connecting the emitter and collector regions, said barrier region:
    (a) comprising p-type semiconductor material,
    (b) having a valence band substantially common with the emitter material valence band,
    (c) having a wider band gap than the emitter material and providing a heterostructure conduction band discontinuity with the emitter region, and
    (d) being arranged such that electron flow between the emitter and collector regions is impeded while corresponding hole flow is substantially unimpeded and the emitter and collector region being adjacent to the same side of the barrier region.

15. An infrared photoconductive detector comprising:
  (1) an n-type semiconducting emitter region of infrared photosensitive material;
  (2) a collector region, the emitter and collector regions being of different band-gap materials of the same majority carrier type, one material being photosensitive to radiation of one wavelength band, the other material being photosensitive to radiation of another wavelength band of the infrared spectrum;
  (3) emitter and collector contacts; and
  (4) a barrier region connecting the emitter and collector regions, said barrier region:
    (a) comprising p-type semiconductor material,
    (b) having a valence band substantially common with the emitter material valence band,
    (c) having a wider band gap than the emitter material and providing a heterostructure conduction band discontinuity with the emitter region, and
    (d) being arranged such that electron flow between the emitter and collector regions is impeded while corresponding hole flow is substantially unimpeded and the emitter and collector region being adjacent to the same side of the barrier region.

* * * * *